(12) United States Patent
Hassoune et al.

(10) Patent No.: US 7,362,140 B2
(45) Date of Patent: Apr. 22, 2008

(54) LOW SWING CURRENT MODE LOGIC FAMILY

(75) Inventors: Ilham Hassoune, Louvain-la Neuve (BE); Jean-Didier Legat, Louvain-la-Neuve (BE)

(73) Assignee: Universite Catholique de Louvain, Louvain-la-Neuve (BE)

( * ) Notice: Subject to any disclaimer, the term of this patent is extended or adjusted under 35 U.S.C. 154(b) by 0 days.

(21) Appl. No.: 11/596,312

(22) PCT Filed: May 13, 2005

(86) PCT No.: PCT/BE2005/000077

§ 371 (c)(1),
(2), (4) Date: Nov. 13, 2006

(87) PCT Pub. No.: WO2005/112263

PCT Pub. Date: Nov. 24, 2005

(65) Prior Publication Data

US 2007/0222475 A1    Sep. 27, 2007

Related U.S. Application Data

(60) Provisional application No. 60/571,383, filed on May 14, 2004.

(51) Int. Cl.
*H03K 19/094* (2006.01)
(52) U.S. Cl. .......................... 326/115; 326/98; 326/121
(58) Field of Classification Search ............ 326/93–98, 326/112, 115, 119, 121; 327/51–57

See application file for complete search history.

(56) References Cited

U.S. PATENT DOCUMENTS

| 4,570,084 A * | 2/1986 | Griffin et al. ................. 326/98 |
| 5,859,548 A * | 1/1999 | Kong .......................... 326/113 |
| 6,028,454 A | 2/2000 | Elmasry et al. |
| 6,211,704 B1 * | 4/2001 | Kong .......................... 326/121 |
| 6,373,292 B1 * | 4/2002 | Choe .......................... 326/121 |
| 6,661,257 B2 * | 12/2003 | Choe .......................... 326/95 |
| 6,982,583 B2 * | 1/2006 | Yin et al. .................... 327/210 |

OTHER PUBLICATIONS

Allam M. W. et al., "Dynamic Current Mode Logic (DYCML): A New Low-Power High-Performance Logic Style", IEEE Journal of Solid-State Circuits, IEEE Inc., New York, US, vol. 36, No. 3, Mar. 2001 (Mar. 2003), pp. 550-558.

(Continued)

*Primary Examiner*—Rexford Barnie
*Assistant Examiner*—Jason Crawford
(74) *Attorney, Agent, or Firm*—Bacon & Thomas, PLLC

(57) ABSTRACT

The present invention provides a low swing current mode logic circuit including: a current mode logic block having data inputs and outputs; a pre-charging circuit for pre-charging the outputs; a dynamic current source; an evaluation circuit for evaluating the logic block during an evaluation phase; and, a feedback path arranged between the outputs and the dynamic current source which is responsive to a difference between the outputs. The simplicity of generating the low swing, achieved by the feedback which may be implemented by only two transistors, is in contrast with the complexity introduced by some methods used by other logic styles for achieving low swing.

10 Claims, 7 Drawing Sheets

OTHER PUBLICATIONS

Guo Y. B. et al., "Voltage comparator circuits for multiple-valued CMOS logic" Proceedings 2002 32ND. IEEE International Symposium on Multiple-Valued Logic. ISMVL 2002. Bostom, MA, May 15-18, 2002, International Symposium on Multiple-Valued Logic. ISMVL, Los Alamitos, CA: IEEE Comp. Soc, US, May 15, 2002, pp. 67-73.

Fahim, A. M et al., "Low-Power High-Performance Arithmetic Circuits and Architectures", IEEE Journal of Solid-State Circuits, vol. 37, No. 1, Jan. 2002, pp. 90-94.

Yamashina, M. et al., "An MOS Current Mode Logic (MCML) Circuit for Low-Power GHz Processors", NEC Res. & Develop., vol. 36, No. 1, Jan. 1995.

* cited by examiner

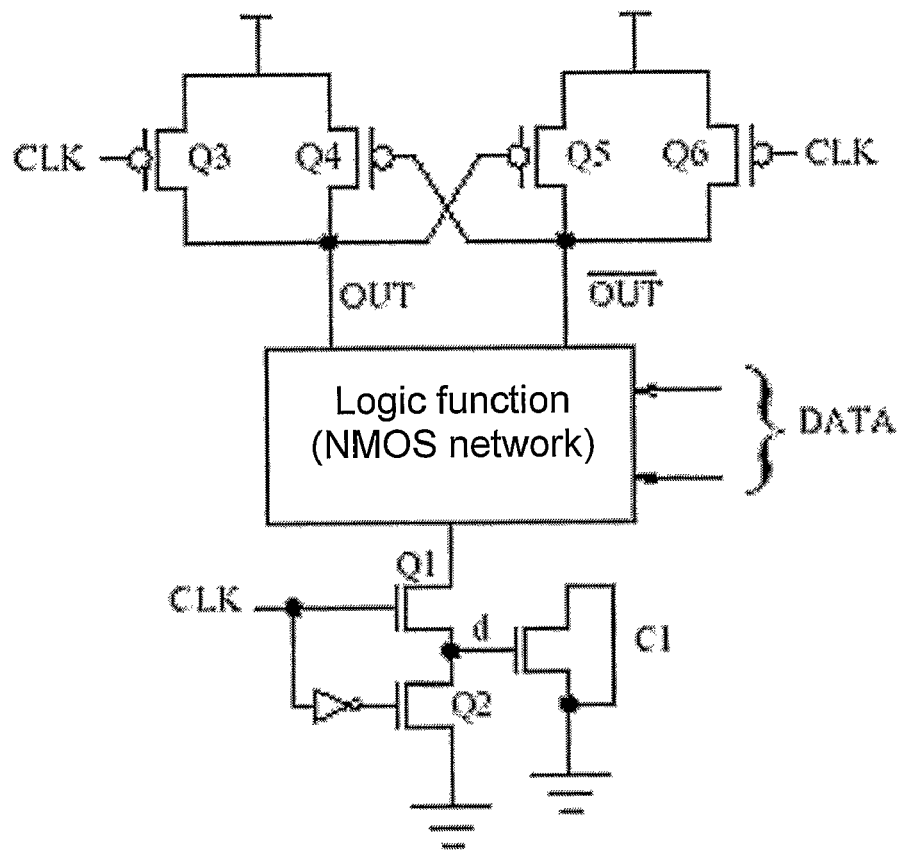
Fig. 2 – Prior art
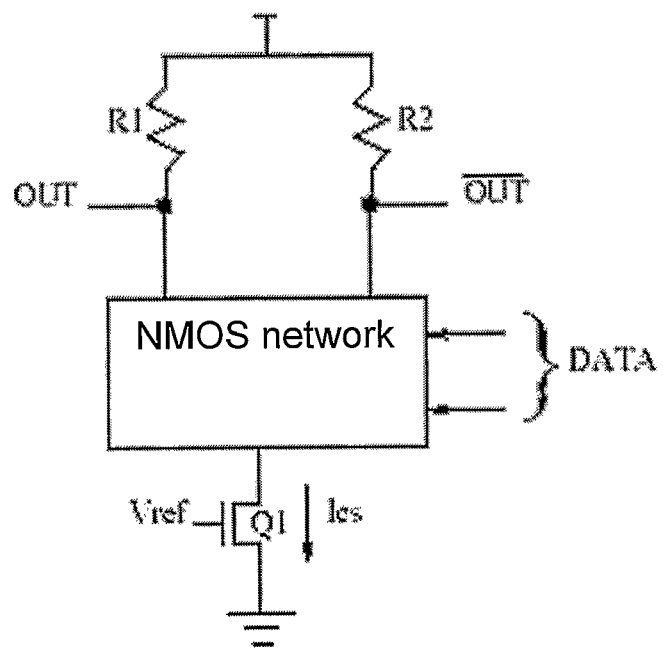
Fig. 3 – Prior art

LOW SWING CURRENT MODE LOGIC FAMILY

This application is a 371 of PCT/BE05/00077 filed on May 13, 2005; which claims benefit of U.S. Provisional Application No. 60/571,383, filed May 14, 2004, is claimed and the entire content thereof is incorporated herein by reference.

TECHNICAL FIELD OF THE INVENTION

The present invention relates to a logic circuit featuring low power consumption, as well as to applications including such logic circuit.

BACKGROUND OF THE INVENTION

Integrated circuits form an essential part of modern electronic equipment. There is an increasing reliance on portable equipment with intensive processing requirements and limited battery life. In view of this, there is considerable interest in a logic style, which offers low power consumption.

Some logic styles are based on decreasing the swing of the signal (reduced swing technique) so as to reduce power consumption.

One of such logic styles is the Short Circuit Current Logic (SCL) as described by Fahim A. M. et Elmasry M. I. in "Low power high performance arithmetic circuits and architectures", JSSC, volume 37, January 2002. In SCL, the limited discharge is partly realised by a short-circuit current of an inverter. The output swing is thus a function of the inverter sizing, but also of the slope of the clock signal.

Another logic, called Clock-Pulse Control Logic (CPCL), uses a pulse to produce a partial discharge of the outputs. This pulse is realised at the start of the leading edge of the clock signal and by a high-pass circuit of the RC type. However, this logic shows a high sensitivity with respect to the value of the load capacitance. This leads to constraints on the sizing of some transistors in the circuit.

The MOS Current Mode Logic (MCML) is a type of logic operation with low swing. It is implemented with a differential pair. The value of input variables controls the current in the two differential branches. This type of logic is described by M. Yamashina and al., in "MOS current mode logic MCML circuit for low power GHz processors", NEC Res. Develop., vol. 36, no. 1, pp. 54-63, January 1995.

SUMMARY OF THE INVENTION

The present invention seeks to provide an alternative logic style.

The above objective is accomplished by a device according to the present invention. Low Power High Performance Logic Style", JSSC, vol. 36, N 3, March 2001. Therefore, it will not be reported here.

In a third aspect, the present invention provides a smart card comprising a logic circuit according to the present invention. Due to a low variation in power consumption of a logic circuit of the present invention with respect to different inputs at a logic gate, a smart card based on a logic circuit of the present invention is more resistant to DPA (Differential Power Analysis) attacks, which consist of predicting a secret code of the smart card by analysis of power consumption.

In a further aspect, the present invention provides an application using digital circuits that, at the same time, require a high performance and a low power consumption, such as for example a microprocessor comprising a plurality of logic circuits according to the present invention.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

Embodiments of the invention are described with reference to the accompanying drawings in which:

FIG. 2 shows the architecture of a prior art DyCML gate;

FIG. 3 shows the architecture of gate with MCML logic;

DESCRIPTION OF ILLUSTRATIVE EMBODIMENTS

Figure 1:
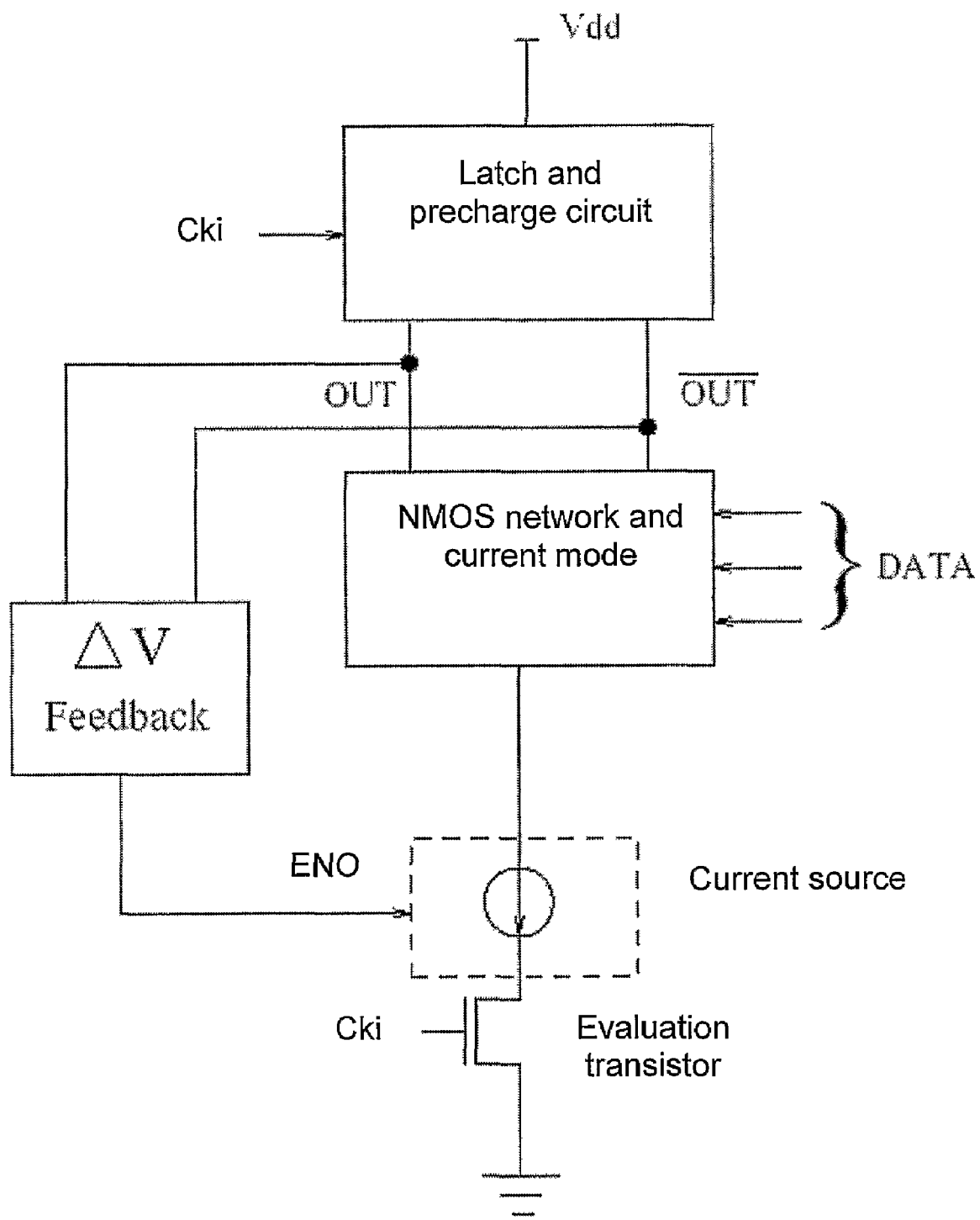
FIG. 1 shows a simplified representation of LSCML logic according to a first embodiment of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is to be noticed that the term "comprising" should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "coupled" should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims. It will be clear for a person skilled in the art that the present invention is also applicable to similar devices that can be configured in any transistor technology, including for example, but not limited thereto, CMOS, BICMOS, Bipolar and SiGe BICMOS technology. Furthermore the findings of the present invention are explained with reference to PMOS and NMOS transistors as an example, but the present invention includes within its scope a complementary device whereby PMOS and NMOS transistors become NMOS and PMOS transistors, respectively. A skilled person can make such modifications without departing from the true spirit of the invention.

Functionality of the Low Swing Current Mode Logic (LSCML) According to the Present Invention The logic (LSCML) proposed in accordance with the present invention is based on a dynamic and differential architecture. The structure of the LSCML comprises:
- a pre-charging circuit;
- a latch for maintaining the logic level of the outputs after evaluation;
- a dynamic current source;
- a feedback path arranged between the outputs and the dynamic current source which is responsive to a difference between the outputs.

Figure 6:
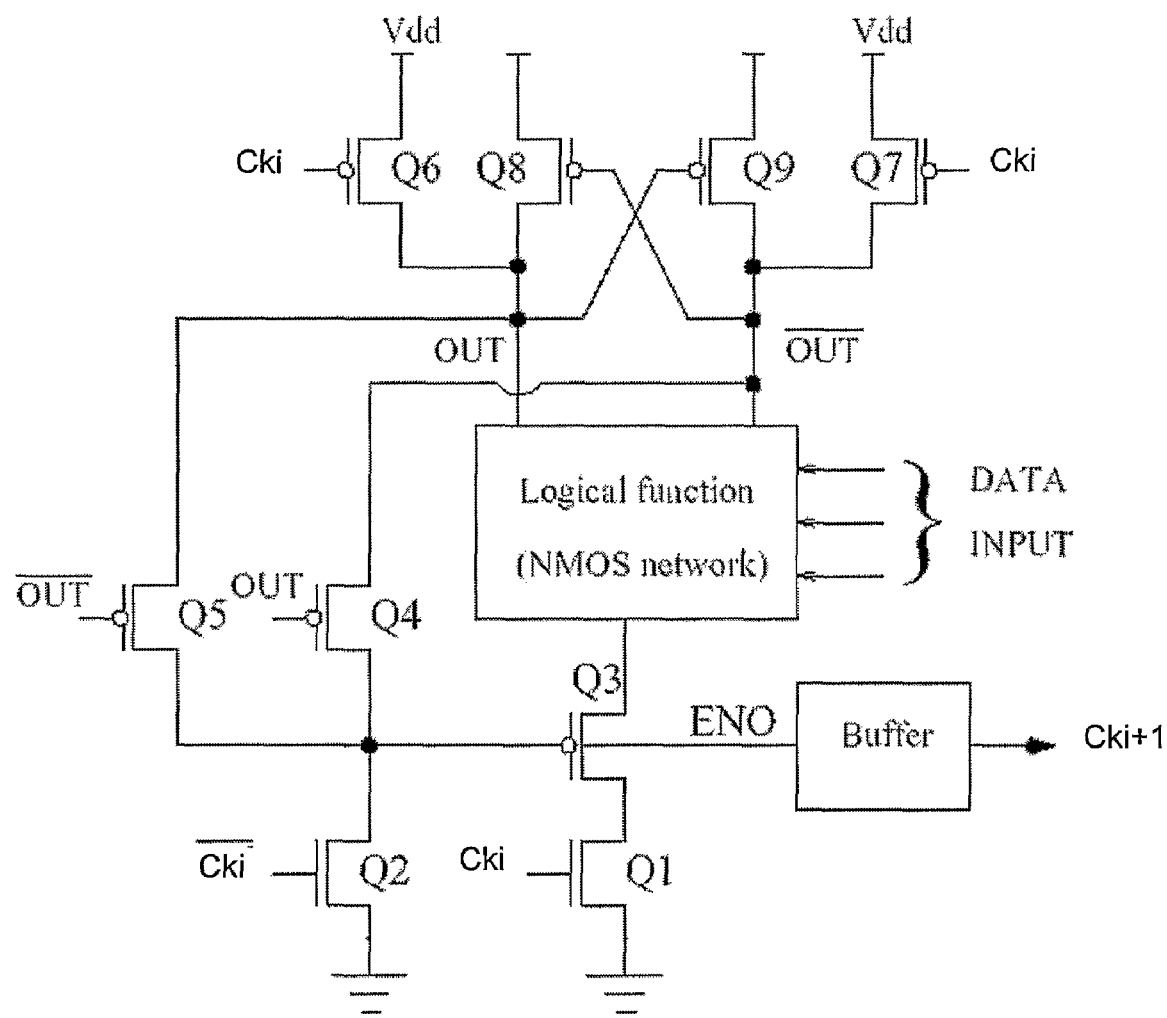
FIG. 6 shows the complete structure of the LSCML logic family according to an embodiment of the present invention.

A simplified representation of this logic is shown in FIG. 1, and a schematic illustration of the complete structure is shown in FIG. 6. The operation is as follows:

During a pre-charging phase (Cki at a low voltage level, e.g. 0 Volts, corresponding to a logic 0): the transistors Q6 and Q7 (forming the pre-charging circuit) are turned ON, thus charging the output nodes OUT and $\overline{OUT}$ to $V_{dd}$. During this time, transistor Q1 is turned OFF, thus eliminating the DC path from $V_{dd}$ to ground. On the other hand, the transistor Q2 turns ON, thus discharging node ENO.

During the evaluation phase (Cki at a high voltage level, e.g. $V_{dd}$, corresponding to a high logic level '1'): the pre-charging circuit is switched OFF while transistor Q1 is switched ON. Two current paths are created from the precharged output nodes to the ground. As these two paths have different impedances because they depend on the input of the logical function, the result is that one of the output nodes will be discharged faster than the other. A first output node OUT or $\overline{OUT}$ will for example be discharged faster than the second output node $\overline{OUT}$ or OUT respectively.

Supposing that the output node OUT is discharged faster. As soon as the voltage at the first output node OUT drops less than $V_{dd}-|V_{tp}|$ ($V_{tp}$ being the threshold voltage of the PMOS transistors Q8, Q9), the transistor Q9 whose gate is connected to this first output node OUT turns ON and charges the second output node $\overline{OUT}$ to $V_{dd}$. On the other hand, as soon as the swing $\Delta V=|OUT-\overline{OUT}|$ becomes $\geq |V_{tp}|$, one of the transistors Q4, Q5 realising the feedback, will switch ON, i.e. Q4 in the example where it is the output OUT which discharges. Thus the node ENO is charged to $V_{dd}$ thus limiting the amount of charge transferred from the output node, and thereby the output swing.

Figure 7:
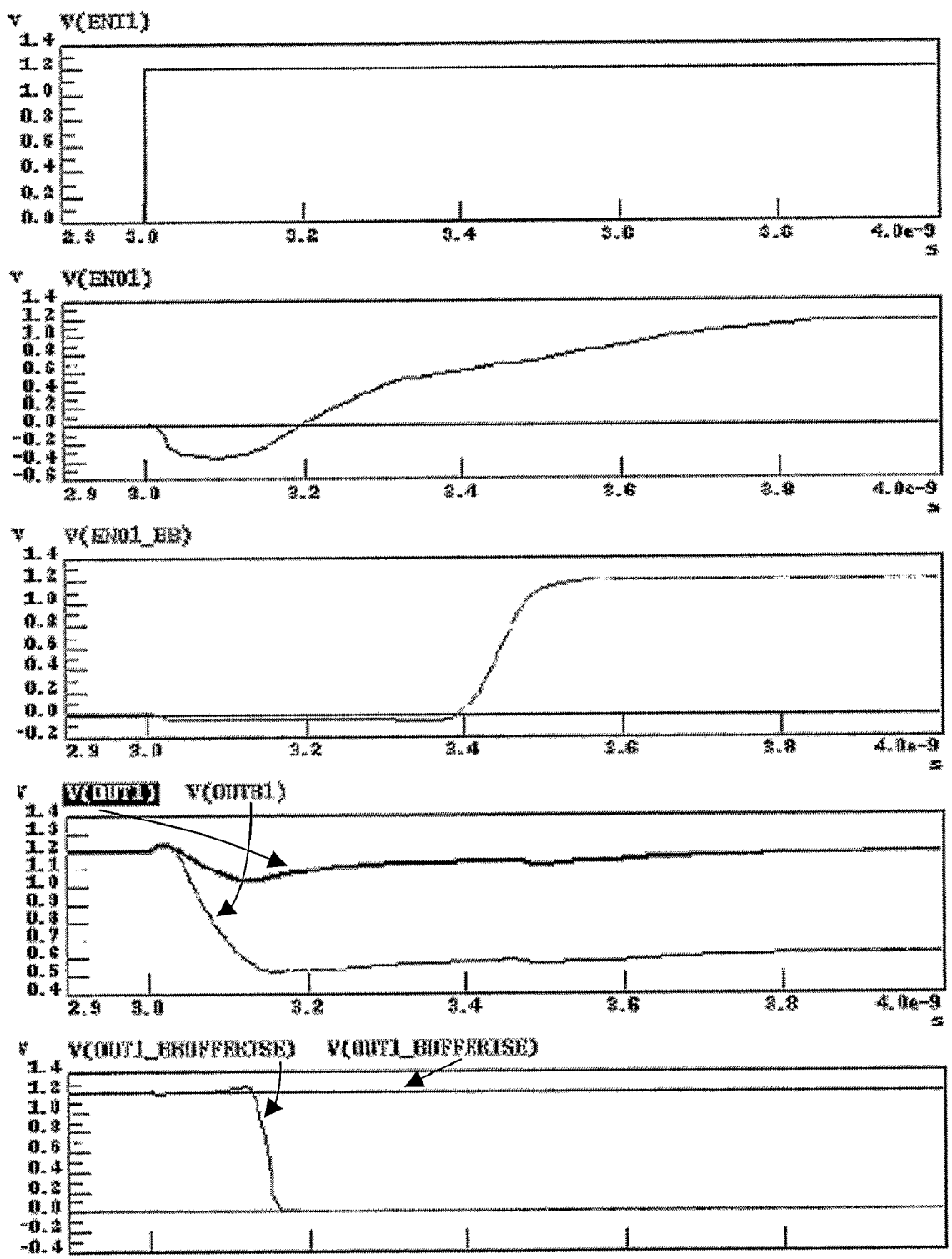
FIG. 7 shows results of the simulation of an inverter implemented with the LSCML logic according to an embodiment of the present invention.
Figure 8:
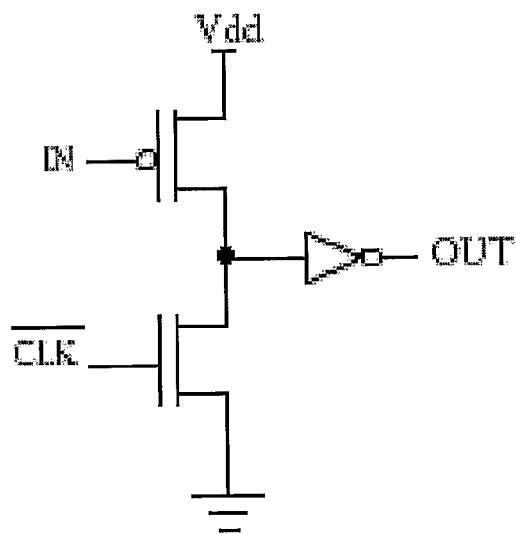
FIG. 8 illustrates a buffer for full-swing, also known as a "single ended buffer"

An illustration of the operation of the LSCML by way of signals is given in FIG. 7. The meaning of the different signals in FIG. 7 is as follows:
- V(ENI1): external clock signal Cki
- V(ENO1): clock signal at node ENO generated by the LSCML block realising the inverter
- V(ENO1_BB): is obtained after buffering of the signal V(ENO1) via the buffer of the clock
- V(OUT1), V(OUTB1): low swing signals obtained at the differential outputs OUT and $\overline{OUT}$ of the LSCML block realising the inverter
- V(OUT1_BBUFFERISE), V(OUT1_BUFFERISE): are obtained after buffering of the low swing signal (outputs V(OUT1) and V(OUTB1)) via a buffer called "single ended buffer", an example of which is illustrated in FIG. 8.

Advantages of the LSCML Logic According to the Present Invention

1. Differential Structure in Current Inode and Low Swing

The LSCML logic of the present invention makes use of the principle of generating low swing. According to the present invention, this is realised by providing a feedback of the differential outputs OUT and $\overline{OUT}$ to the current source, e.g. implemented by means of transistors Q4 and Q5 in the implementation illustrated in FIG. 6.

The LSCML logic exploits the advantage of the known MOS Current Mode Logic (MCML) which operates with low swing (difference between the outputs OUT and $\overline{OUT}$). This helps to reduce the dynamic power consumption. At the same time, it uses a dynamic current source which reduces (eliminates) DC power consumption which appears in MCML logic. One of the disadvantages of the MCML consists in the increased static consumption due to the constant current source (corresponds to the transistor Q1 in FIG. 3). This dc current source is controlled by voltage $V_{ref}$ (FIG. 3). The LSCML uses a dynamic current source (controlled by the clock signal) which eliminates the static power consumption.

2. Self-Timing

A further advantage of the LSCML logic is 'self-timing'. Indeed, in case of cascading of a plurality of blocks or levels, each level generates the clock signal for the subsequent level. During the pre-charging phase of level i, i.e. the elements of the pre-charging circuit, comprising transistors Q6 and Q7 in the embodiment implemented in FIG. 6, are switched ON, as well as transistor Q2, the node ENO is discharged to '0', thus generating phase 0 of the clock signal Cki+1 for level i+1.

During the evaluation phase of level i, Cki at a high voltage level, corresponding to logic level 1, as soon as the swing ΔV becomes >|$V_{tp}$|, the (parasitic) capacitance at node ENO charges, in this way generating phase 1 of the clock signal Cki+1 of level i+1. This signal is then preferably buffered before attacking the next level.

The 'self-timing', i.e. each block generating the clock signal for the next block, is certainly less advantageous than a clock delay from the point of view of speed. The clock delay consists in using a buffer (2 inverters in series) to introduce a delay with respect to the external clock signal that attacks the first level, taking care of sizing the buffer such that its delay is larger than the delay of the gate, so that a next block will be switched on only when the previous block has finished.

However, the self-timing is more robust in case of variation of some operation parameters, such as power supply $V_{dd}$, temperature or clock-skew (the delay introduced by the interconnection lines, which appears most often in large circuits), which minimises the risk for errors. The self-timing allows the evaluation of a level only if the previous level has finished its evaluation. This guarantees more stability of circuit operation.

3. Obtaining a Full Swing Signal at the Output

In order to obtain a full swing signal at the output of a block or cascade, a same buffer as used by the DyCML logic may be used. This buffer called single ended buffer is illustrated in FIG. 8. Its operation has been described by Mohamed W. Allam and Mohamed I. Elmastry in "Dynamic Current Mode Logic (DyCML): New Low Power High Performance Logic Style", JSSC, vol. 36, N 3, March 2001, and will not be reported here.

4. Buffering of the Clock Signal

Figure 9:
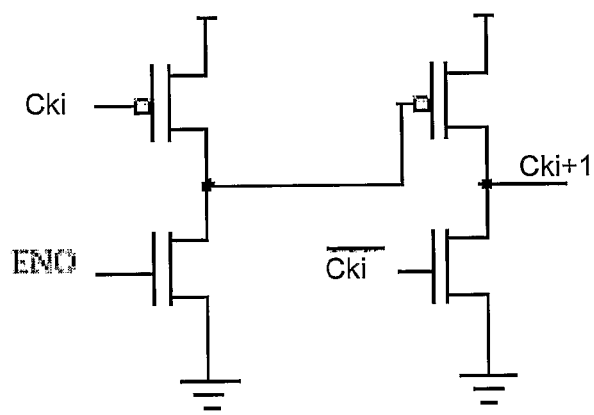
FIG. 9 illustrates a buffer of the clock signal.

In order to buffer the clock signal generated by an LSCML block and to make its slope steeper before it is being used by the next block, a clock signal buffering circuit as the one illustrated in FIG. 9 may be used. This circuit is also used by the DyCML logic for converting the generated clock signal with reduced swing into a full-swing signal. As its operation has been described in the same DyCML document as mentioned above, it will not be repeated here.

It will be noticed hereafter that the use of the signal ENO generated by an LSCML block and thereafter buffered through the circuit illustrated in FIG. 9 slows down a circuit based on LSCML in case of cascading. Nevertheless, the use of the signal ENO proves to be best adapted for low power applications.

5. Comparison of LSCML According to the Present Invention with Prior Art DyCML Logic The principle of operation of the LSCML logic illustrated in FIGS. 1 and 6 is close to that of the DyCML logic illustrated in FIG. 2.

In general, the DyCML comprises:
a pre-charging circuit;
a latch for maintaining the logic levels of the outputs after evaluation;
a dynamic current source; and
a transistor used as capacitor and which acts as a virtual ground—illustrated as C1 in FIG. 2—for limiting the amount of charge transferred from the output node and thus the output voltage swing, but also for generating the internal clock signal of the logic, thus performing self-timing of the DyCML logic.

The LSCML logic according to the present invention shows the same advantages of the one in FIG. 2. The difference between the 2 logic styles firstly consists in the realisation of low swing: the DyCML logic uses a transistor used as a capacitor (C1 in FIG. 2), which, once it is charged, limits the discharge, hence realising the low-swing. On the other hand, the LSCML uses a feedback—with 2 transistors, e.g. PMOS transistors—of the outputs of the differential structure towards the current source, for limiting the discharge as soon as the swing between the outputs reaches the threshold voltage |$V_{tp}$| of the two transistors used in the feedback. The second difference is in the generation of the clock signal for the next level in case of cascading. The low swing in DyCML logic is realised by means of a transistor used as capacitor (C1), but this transistor is also used for the generation of the clock signal for the next block. In other words, this capacity is discharged during the pre-charging phase of level i, generating state "0" of the clock signal of the next level (signal at node "d" in FIG. 2). During evaluation of level i, the current flowing through the current source Q1 charges the capacitance C1. As soon as the voltage at node "d" reaches a value such that $V_{ds}$ of the transistor Q1 is close to zero, Q1 is switched off, thus limiting the amount of charge transferred from the output node. The signal at node "d" is then at $V_{dd}$–ΔV, thus generating the phase '1' of the clock signal for the block i+1.

This signal will in DyCML logic afterwards be converted to a full-swing signal by a buffer circuit as disclosed by Mohamed W. Allam and Mohamed I. Elmasry in "Dynamic Current Mode Logic (DyCML): New Low Power High Performance Logic Style", JSSC, vol. 36, N3, March 2001. In the LSCML the same buffer circuit as in DyCML was used to buffer the clock signal at node "ENO". This buffer circuit is depicted in FIG. 9.

6. Comparison of LSCML According to the Present Invention with Prior Art MCML Logic In the circuits in current mode logic, also called MCML logic as described by M. Yamashina and al. in "MOS current mode logic MCML circuit for low power GHz processors", NEC Res. Develop., vol. 36, no. 1, pp. 54-63, January 1995, the value of the logic outputs of a gate depends on the difference between the currents in the 2 branches of the circuit. An illustration of a gate with MCML logic is shown in FIG. 3. The values of the currents depend on the inputs of the logic function realised by the NMOS network. The MCML based circuits feature a small output swing, which helps to reduce the dynamic power consumption and the cross-talk between adjacent signals. However, the MCML logic has 2 major disadvantages which strongly limit its use in digital systems. The first disadvantage consists in the increased static power consumption due to the constant current source (corresponds to the transistor Q1 in FIG. 3). The second disadvantage is due to the use of resistors in the pre-charging circuit (R1 and R2 in FIG. 3). This leads to some constraints in fabrication technologies and area.

The LSCML logic is based on a current mode operation as in the MCML logic. However, the LSCML eliminates the disadvantages of the MCML logic. This is done by using, in the LSCML, a dynamic pre-charging network (controlled by a clock signal) with 2 transistors, instead of 2 resistors. The constant current source which causes an important static power consumption, is in the LSCML logic replaced by a dynamic current source. This allows a significant decrease of the DC power consumption of the circuit.

Optimisation of the LSCML for High Performance Applications

As introduced above, the use of the signal ENO generated by the LSCML block slows down the circuit in case of cascading. This slowness is generated by the fact that the signal ENO is generated by the way of the feedback in the LSCML. This explains the important delay in the generation of the clock signal ENO. Nevertheless, the use of the signal ENO generated by the LSCML allows to obtain a saving in power consumption, while it guarantees to the LSCML logic gates a self-timing operation. As from here on, self-timing using the signal ENO as explained above will be called self-timing ST1.

Figure 10:
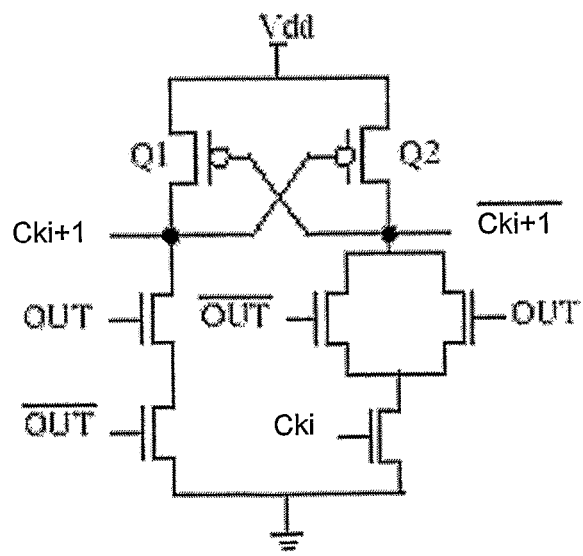
FIG. 10 shows a circuit for auto-synchronisation of the LSCML logic according to embodiments of the present invention for high performance applications.

To make the self-timing of the LSCML independent of the feedback, another solution is proposed according to an embodiment of the present invention for the generation of the clock signal which will be used by a block i+1 of a circuit based on LSCML and which consists of an AND/NAND gate conditioned by the clock signal of block i of the circuit. This conditioning allows to control the evaluation of block i+1 and allowing this evaluation only if block i has finished its evaluation. The proposed self-timing solution is illustrated in FIG. 10. It helps to increase the speed of circuits based on LSCML logic style in case of cascading. This solution lies in a static Differential Cascode Voltage Switch Logic based circuit. This solution, called self-timing ST2 hereinafter, allows to obtain a better speed with regard to the self-timing ST1, because it depends on the evaluation delay of the previous block which is less than the delay of the signal ENO. This thus allows at the same time a higher speed and a self-timing operation.

Nevertheless, the input signals of this self-timing circuit are "full-swing" signals of the previous LSCML block. Therefore, the power consumption of the full-swing buffers is to be included in the power consumption of the circuit generating the completion signal, and consequently in the total power consumption of the LSCML circuit. This has as a disadvantage that it raises the total power consumption. This is not the case in LSCML using the self-timing ST1 as described above and where the cascading is independent of the full-swing signals. Therefore, in the ST1 self-timing case, the consumption of the full-swing buffers is not included in the consumption of the circuit.

The proposed self-timing ST2 operates as follows:

During the pre-charge phase (Cki at low voltage level, e.g. 0 Volts, corresponding to logic 0): The nodes OUT and $\overline{OUT}$ (representing the buffered signals, i.e. the full-swing signal, of an LSCML block i) are at $V_{dd}$. The node Cki+1 is then discharged to 0, thus generating the pre-charge phase of the clock signal of the LSCML block i+1. As the signal entering Cki is at low logic level, e.g. 0, the result is that there is no current path towards the ground in the other differential branch. As node CKi+1 is discharged, the transistor Q2 switches ON, thus charging the node $\overline{Cki+1}$ to $V_{dd}$, thus generating the first phase of the complementary signal of Cki+1, required for discharging node ENO in LSCML block i+1 during the pre-charging phase, as illustrated in FIG. 6.

During the evaluation phase (Cki at high voltage level, e.g. $V_{dd}$, corresponding to high logic level '1'): Two cases can occur:

$1^{st}$ case: OUT is at $V_{dd}$ and $\overline{OUT}$ is at 0

$2^{nd}$ case: OUT is at 0 and $\overline{OUT}$ is at $V_{dd}$

In both cases, $\overline{Cki+1}$ is discharged to '0', thus generating the $2^{nd}$ phase of the complementary signal $\overline{Cki+1}$ of the LSCML block i+1 although there is no current flowing through the other differential branch. The node $\overline{Cki+1}$ being discharged to '0', the transistor Q1 switches ON, thus charging the node Cki+1 to $V_{dd}$, and thus generating the evaluation phase of the clock signal of LSCML block i+1.

The signals Cki+1 and $\overline{Cki+1}$ obtained by the way of this self-timing circuit are full-swing signals and have a rather steep slope. Thus, there is no need for using a buffer for the outgoing clock signal.

By using the self-timing circuit ST2, the LSCML logic for high performance applications shows another difference, besides the ones already mentioned, with regard to the DyCML logic as it does not use the signal at node ENO to perform the self-timing. However, it is still used to realise the reduced swing. By analogy with the DyCML, it is the signal at node d which allows to realise both the self-timing and the reduced swing.

A first aspect of the present invention provides a low swing current mode logic circuit comprising:

a current mode logic block having data inputs and outputs;

a pre-charging circuit for pre-charging the outputs;

a dynamic current source;

an evaluation circuit for evaluating the logic block during an evaluation phase; and, a feedback path arranged between the outputs and the dynamic current source which is responsive to a difference between the outputs.

The invention described in detail hereinafter is based on a principle similar to the one of the Dynamic Current Mode Logic (DyCML) as described by Mohamed W. Allam and Mohamed I. Elmasry in "Dynamic Current Mode Logic (DyCML): New Low Power High Performance Logic Style", JSSC, vol. 36, N3, March 2001; and in U.S. Pat. No. 6,028,454. DyCML uses the principle of a virtual ground for producing the low swing. The new aspect of the invention comprises:

the realisation of low swing with feedback, and the realisation of the feedback itself ($\Delta V$) which, in a preferred embodiment, is achieved by 2 PMOS transistors.

The simplicity of generating the low swing, achieved by the feedback which may be implemented by only two transistors, is in contrast with the complexity introduced by some methods used by other logic styles for achieving low swing.

A logic circuit according to the present invention may further comprise a latch for maintaining the level of the outputs after the evaluation phase of operation.

In a second aspect, the present invention provides a cascade of a plurality of logic circuits according to the present invention, wherein a first of the logic circuits receives a clock signal at an input and provides an output which forms the clock signal for a subsequent circuit. This is called self-timing. The self-timing is more robust in case of variation of some operation parameters such as power supply or temperature. Furthermore, self-timing allows the evaluation of a level only if the previous level has finished its evaluation, which guarantees more stability of circuit operation.

Figure 11:
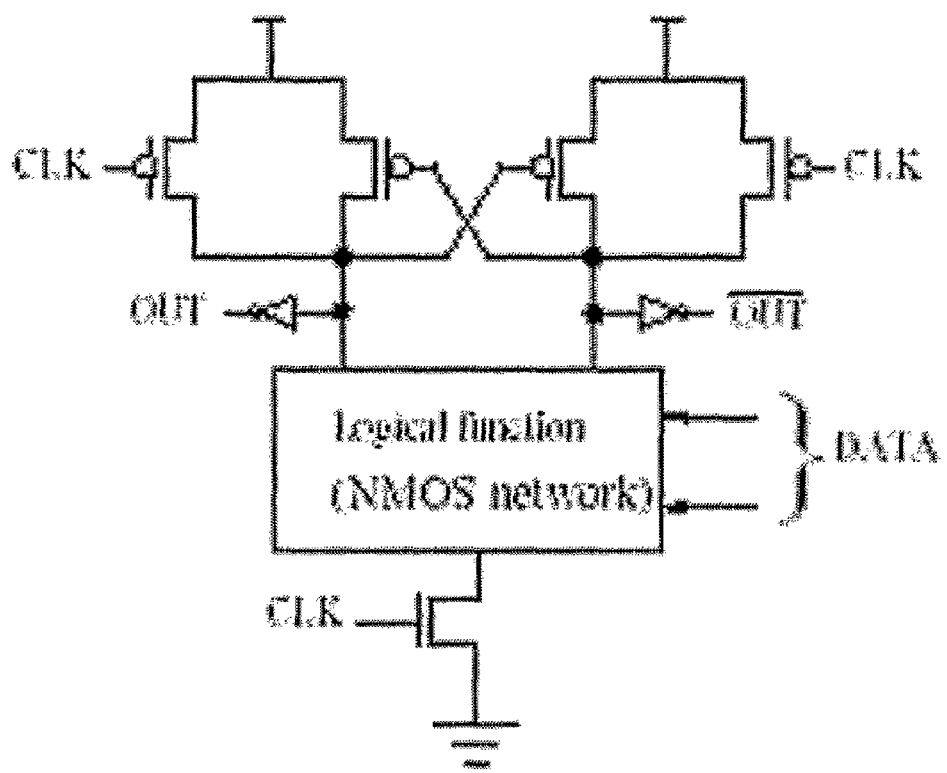
FIG. 11 illustrates the structure of a DDCVSL gate.

A cascade according to the present invention may further comprise a buffer circuit to buffer the clock signal generated between adjacent logic circuits in the cascade. The operation of such buffer circuit has been described by Mohamed W. Allam and Mohamed I. Elmastry in "Dynamic Current Mode Logic (DyCML): New Application of the LSCML for the Implementation of Basic Logical Functions In order to evaluate performances and power consumption of logic gates implemented with LSCML, a plurality of logic gates have been considered, such as e.g. NAND/AND, NOR/OR, XOR/$\overline{\text{XOR}}$ and full adder. Comparisons have been carried out between those logic gates implemented with LSCML and their counterparts implemented with DyCML, DDCVSL and standard CMOS logic. Particularly, the DDCVSL (Dynamic Differential Cascode Voltage Switch Logic) (see FIG. 11), which is a full-swing logic, has been considered, because it is known to be a very fast logic family. Indeed, it has been shown in literature that gates implemented with DDCVSL have a higher speed in comparison with their counterparts implemented with standard CMOS logic. It should be pointed out as well that the DDCVSL and the standard CMOS logic both are full-swing logic styles. This choice allows to compare LSCML, which is a low swing logic style, with full-swing logic styles.

Simulations have been performed in 0.13 μm Partially Depleted (PD) Silicon-On-Insulator (SOI) CMOS technology under a $V_{dd}$=1.2 V. The gates implemented with the different logic styles considered have been sized such as to optimise the Power Delay Product (PDP). Particularly, as the DyCML and LSCML logic are low-swing logic styles, besides the goal of achieving an optimal PDP product, the gates implemented with these two logic styles have been sized such as to operate with a same output voltage swing ΔV, and this in order to enable fair comparisons. The power consumption of the full-swing buffers of the logic outputs has not been included in the power consumption of the cells implemented with LSCML and DyCML logic styles. The same holds for the output drivers (output inverters) in the DDCVSL. On the other hand, the power consumption shown in tables I and II includes the power consumption of self-timing and the clock buffering circuits in the LSCML, DyCML and DDCVSL logic styles. The delay given here is the worst-case delay.

For sake of comparison the simulation results are given in table I the full-swing logic styles CMOS and DDCVSL. On the other hand, gates implemented with DDCVSL logic style show the highest speed.

With respect to the PDP, those NAND, NOR and XOR gates implemented with CMOS logic and with DDCVSL show values close to each other and are advantageous in comparison to those gates implemented with DyCML and LSCML. The full adder implemented with DDCVSL shows the best PDP.

The gates implemented with DyCML and LSCML show the highest PDP. This is due to the extra circuitry required to realise both the low swing and the self-timing. Nevertheless, the DyCML and the LSCML have the advantage over DDCVSL and the standard CMOS of being asynchronous in nature. This allows to avoid clock-skew in large chips and makes them particularly interesting for delay insensitive applications. On the other hand, it is useful to remind that when using a logic style which is not self-timing, one has to either use extra circuitry controlled by an external clock (e.g. in case of using static logic styles such as the standard CMOS), or to oversize the clock trees to avoid wrong evaluations (e.g. in case of synchronous dynamic logic styles such as the DDCVSL using the clock-delay to generate the clock signal for the next block in case of cascading). This will increase both the power consumption and the delay.

In Table I, one can note that gates implemented with LSCML using the self-timing ST1 circuit consume less than their counterparts implemented with DyCML. The gates implemented with LSCML using the self-timing circuit ST2 are faster than their counterparts implemented with DyCML. Nevertheless, these latter show the best PDP product when compared to those implemented with LSCML (ST1) and LSCML (ST2).

TABLE I

|  |  | CMOS | DDCVSL | DyCML | LSCML (ST1) | LSCML (ST2) |
| --- | --- | --- | --- | --- | --- | --- |
| NAND/AND | Power Consumption (μW) | 5.12 | 8.65 | 8.2 | 7.5 | 13.85 |
|  | Delay (ps) | 68 | 44.2 | 218 | 523 | 150 |
|  | PDP (Joule) | 0.35e−15 | 0.38e−15 | 1.78e−15 | 3.92e−15 | 2.07e−15 |
| NOR/OR | Power Consumption (μW) | 5.46 | 8.65 | 8.2 | 7.5 | 13.85 |
|  | Delay (ps) | 70.8 | 44.2 | 218 | 523 | 150 |
|  | PDP (Joule) | 0.38e−15 | 0.38e−15 | 1.78e−15 | 3.92e−15 | 2.07e−15 |
| XOR/$\overline{\text{XOR}}$ | Power Consumption (μW) | 5.67 | 8.9 | 8.22 | 7.4 | 15 |
|  | Delay (ps) | 75.7 | 47 | 215 | 540 | 160 |
|  | PDP (Joule) | 0.43e−15 | 0.42e−15 | 1.77e−15 | 3.99e−15 | 2.4e−15 |
| FA 1b | Power Consumption (μW) | 11.6 | 15.4 | 10 | 9.84 | 18.6 |
|  | Delay (ps) | 227 | 106 | 274 | 684 | 200 |
|  | PDP (Joule) | 2.63e−15 | 1.63e−15 | 2.74e−15 | 6.73e−15 | 3.72e−15 |

Figure 4:
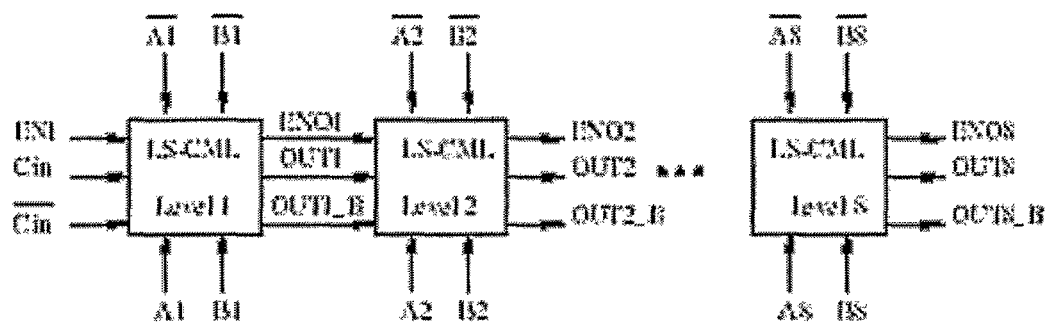
FIG. 4 shows a cascade of a plurality of levels, in the example given eight levels, implemented with LSCML logic according to an embodiment of the present invention, for generating a carry for an 8-bit "Ripple Carry Adder"
Figure 5:
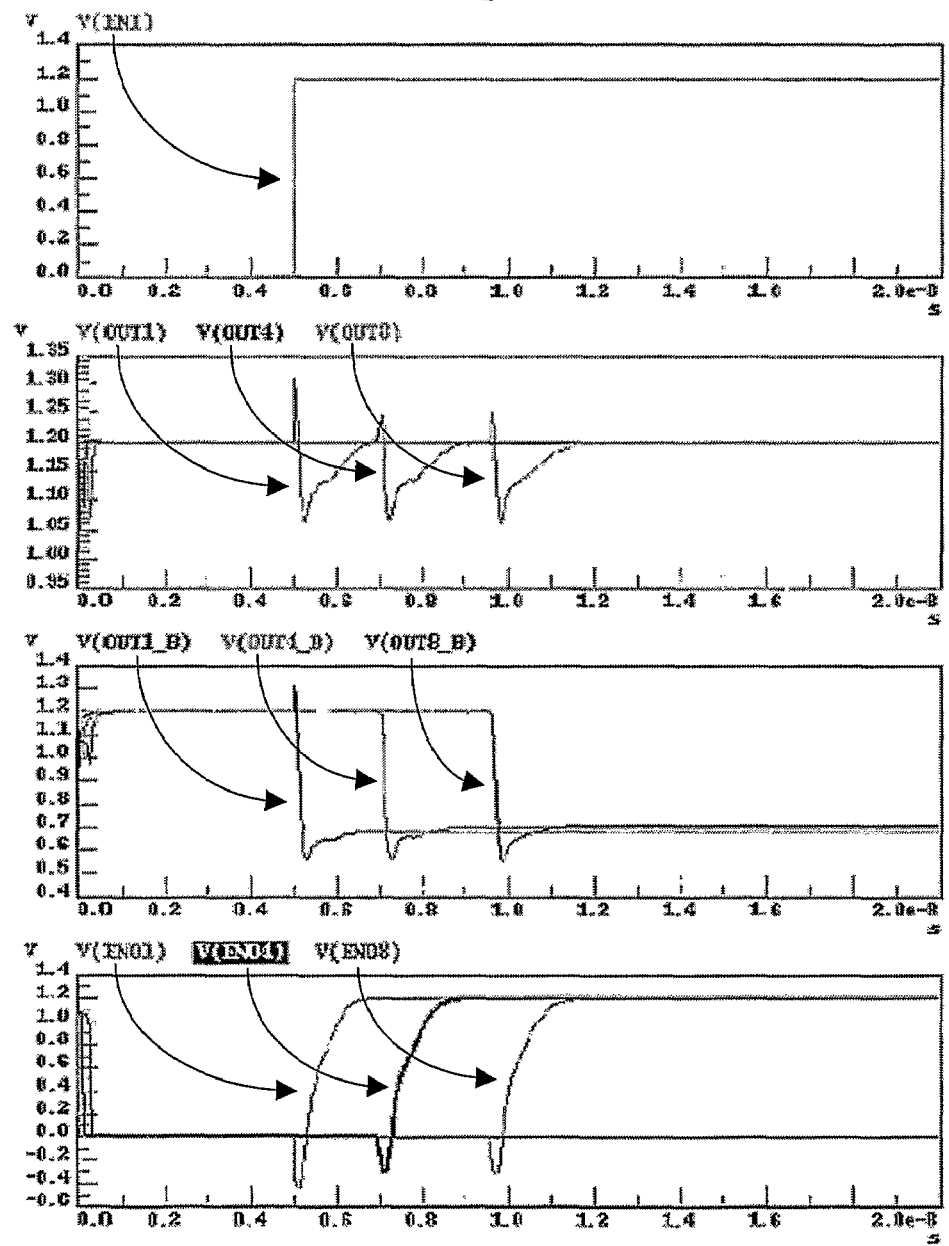
FIG. 5 shows results of a simulation of the cascade of FIG. 4.

These results show that NAND, NOR and XOR gates implemented with standard CMOS logic consume the least power compared to their counterparts implemented with the other logic styles. The full-adder (FA) implemented with the low-swing logic styles DyCML and LSCML (ST1) consumes the least compared to full-adders implemented with Application of the LSCML for the Implementation of Complex Logical Functions The LSCML logic has been used for the carry generation of an 8-bit ripple carry adder. The cascading of 8 levels is shown in FIG. 4. Illustration of the output signals resulting from simulation of 8-bit carry calculation block are shown in FIG. 5, where:

V(ENI) is the external clock signal attacking the first LSCML block of the circuit.

V(OUT1), V(OUT4) and V(OUT8) are respectively the non-buffered outputs which do not discharge, of the first, fourth and eighth level, respectively.

V(OUT1_B), V(OUT4_B) and V(OUT8_B) are respectively the non-buffered outputs (low swing signal) which do discharge at the differential outputs, of the first, fourth and eighth level, respectively.

V(ENO1), V(ENO4) and V(ENO8) are the clock signals generated respectively by the first, fourth and eighth level.

This same function of the carry propagation of the carry over 8 bits has been implemented with other types of logic, i.e. DyCML, DDCVSL and the standard CMOS. The results of the simulation in the 0.13 μm PD SOI CMOS technology under $V_{dd}$=1.2 V are given in Table II hereinbelow.

TABLE II

|  | Power consumption (μW) | Delay (ns) | PDP (Joule) |
|---|---|---|---|
| CMOS | 9.63 | 0.62 | 0.6e−14 |
| DDCVSL | 28.6 | 1.83 | 5.23e−14 |
| DyCML | 17.8 | 2.5 | 4.45e−14 |
| LSCML (ST1) | 17.7 | 5.7 | 10e−14 |
| LSCML (ST2) | 29.7 | 1.93 | 5.73e−14 |

This table shows that the carry calculation for an 8-bit ripple-carry adder is more advantageous when implemented with the static CMOS compared to its counterparts implemented with dynamic differential logic styles. The low power consumption of the function implemented with CMOS logic is due to the same reasons as previously set out, i.e. the low activity factor in the static CMOS logic in comparison to the significant activity factor in the dynamic logic styles and the extra circuitry in the dynamic differential logic which increases the power consumption of these latter.

The advantageous delay which appears in the 8-bit circuit implemented in CMOS may be explained by the fact that in the DDCVSL, DyCML and LSCML logic, the speed of evaluation depends on the speed of the clock signal, and that in case of the function of the carry propagation, the delay of the clock signal in the gates implemented with the dynamic logic here considered, is higher than the delay of the propagation of the carry signal in the gate implemented with standard CMOS.

The function of the 8-bit carry calculation implemented with DDCVSL shows to be the fastest among those implemented with dynamic differential logic. Nevertheless, the delay in those implemented with LSCML logic using the self-timing circuit ST2 is hardly 5.5% slower than its equivalent in DDCVSL.

The 8-bit circuits implemented with DyCML and LSCML logic using the self-timing circuit ST1, are those which consume the least among the circuits based on the considered differential dynamic logic styles. Although the best PDP product between the latter is the one obtained with DyCML. It is to be noted that there is a significant reduction of the PDP product in the LSCML logic when the circuit ST2 is used.

Finally, as can be seen from Table II, the circuit implemented with LSCML using the self-timing circuit ST2 is hardly 5.5% slower than the one implemented with DDCVSL and only consumes 3.8% more, while ensuring a self-timing operation and thus a better reliability.

Application of the LSCML in the Security of Smart Cards

It has been shown that there is a link between certain data characterising circuits realising cryptographic operations and the treated data. These links can be used to establish attacks against the implementation of particular encryption algorithms. Such attacks are often designated in the literature as "Side-Channel Attacks". The parameters which might reveal information about the data treated during an encryption operation are enumerated hereinunder:

The execution time of an encryption operation (susceptible of revealing characteristics concerning the executed operation or the treated data after a "timing attack").

The power consumption linked to an encryption operation (susceptible of revealing information both about the realised operation—"Simple Power Analysis Attack"—and about the treated data—"Differential Power Analysis Attack; DPA).

The electromagnetic radiation generated by the circuit ("Electromagnetic Attack"; EMA).

The cryptographic components used for smart cards, manage to protect itself against algorithmic attacks which consist of predicting the secret code of a smart card starting from the evaluation of the execution time of the instructions. This is done by putting dummy instructions such as to standardise the execution time of the sequences of the crypto-algorithm.

However, designers in cryptography are impotent against attacks which analyse power. The hardware implementation of the crypto-algorithm often leads to a loss of information about the secret code.

When analysing the power consumption behaviour of the standard CMOS logic, weaknesses at the level of an existing relationship between power consumption of a circuit and the data treated by it can easily be seen. It can be imagined that the principal contribution to the power consumption of a gate is due to its dynamic power consumption (thus neglecting the power consumption due to short-circuit currents and leakage currents). This can be modelled by the following expression:

$$P_{dyn} = C_L V_{DD}^2 f_{clk} P_{0 \to 1}$$

wherein $C_L$ is the load capacitance of the CMOS gate, $V_{DD}$ is the supply voltage of the circuit, $f_{clk}$ is the clock frequency, and $P_{0 \to 1}$ is the probability of transition of the output of the gate from a first logical value, the low logic level, e.g. level '0', to a second logical value, the high logic level, e.g. level '1', corresponding to the charge of the output capacitance from 0V to $V_{DD}$. This probability of transition is directly linked to the logic function implemented by the considered CMOS gate under consideration, and thus to the data treated by the circuit.

This power consumption behaviour can be directly used by an attacker desiring to obtain information about the data treated by the circuit. Indeed, the attacker can estimate the power consumption of a circuit realised in CMOS by predicting the quantity of transitions that occur in the circuit at time t.

When considering a circuit realising an encryption operation by means of a K bit long key, during an attack, the goal is to find the whole of the K bits of the key used for the encryption of the data, or at least a certain number of bits k of this key. For these k bits, there are $n=2^k$ possible values of the key.

To realise an attack, this will be partitioned into three steps:

Step 1—prediction: for a number m of texts to be encoded, and for the n possible values of the key, a prediction of the number of transitions occurring in the circuit for every text to be encrypted. This results in a prediction matrix P of size m×n.

Step 2—measurement: the real power consumption of the circuit that realises the encryption operation of the same m texts as those used for the prediction is measured. A measurement vector M with length m is obtained.

Step 3—correlation: The existing correlation between the prediction for every possible key with size k and consumption measurement is calculated. This is done by using the Pearson coefficient by which every column of the matrix P is correlated with the vector M. If the prediction made based on the key is correct, this would give the largest possible correlation value between the prediction and the measurement.

To counteract this loss of information which is linked to the power consumption behaviour in CMOS, it has been proposed to implement the algorithm with logic families in which power consumption is independent (or almost independent) of the data. This would have the advantage of generating a power consumption of which the value is independent of the value of the input variables. Therefore, in this case it is not possible to correlate the number of transitions occurring in the circuit with the power consumption to obtain information about the secret data treated by it.

It seems, however, that not all dynamic and differential logic families are equal in terms of security against power analysis. Indeed, even if all would have a constant activity of the gates, depending on the structure of the gates (the logic function is realised by means of particular nMOS or pMOS transistor networks), variation in power consumption with the different data inputs will appear. These variations are in fact linked to variations of the total load capacitance, due to the variation of the number of parasitic capacitances in the transistor network that implements the logic function.

To counteract this phenomenon, it is proposed to use certain logic families that can make the power consumption independent of the input variables, in terms of both the switching activity and the parasitic capacitance effect. Among these, SABL (Sense Amplifier Based Logic) has been proposed as a solution for the variation in the power consumption. For this sake, the whole of the internal capacitances are discharged for all sets of input variables. This allows to make the power consumption uniform at the expense of a significant increase of the power consumption.

Particularly, it has been shown (F. Macé, F.-X. Standaert, I. Hassoune, J.-D. Legat, J.-J. Quisqater, "A Dynamic Current Mode Logic To Counteract Power Analysis Attacks", proc. DCIS 2004, pp. 186-191, 2004) that the DyCML which is one of the differential and dynamic families operating in current mode, allows to obtain for performances identical security margins (in accordance with the rules defined by the authors of the SABL), while featuring better results in terms of speed and power consumption than in SABL.

Figure 12:
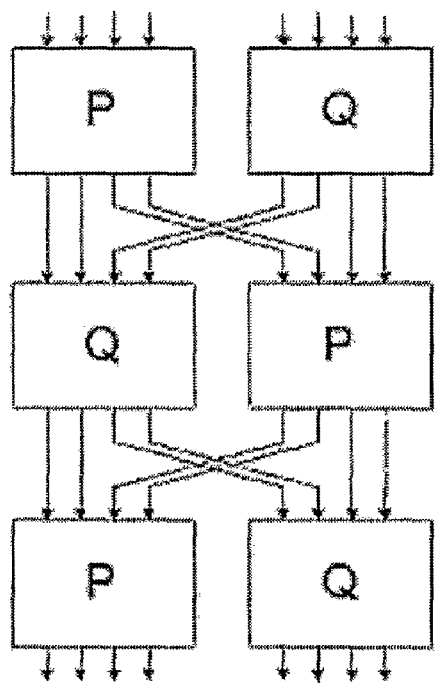
FIG. 12 illustrates the structure of an Sbox of Khazad.

In this context, the use of LSCML according to the present invention has been evaluated and compared to other logic families. Therefore, simulations of the power consumption have been performed on an Sbox of the Khazad algorithm. The Khazad Sbox consists of a circuit of 8 input bits and 8 output bits, implemented with 4 bit subcircuits, representing the functions P and Q, as illustrated in FIG. 12.

A hexadecimal table of values for the function P is given in Table III:

TABLE III

| | | | | | | | | u | | | | | | | | |
|---|---|---|---|---|---|---|---|---|---|---|---|---|---|---|---|---|
| | 0 | 1 | 2 | 3 | 4 | 5 | 6 | 7 | 8 | 9 | A | B | C | D | E | F |
| P(u) | 3 | F | E | 0 | 5 | 4 | B | C | D | A | 9 | 6 | 7 | 8 | 2 | 1 |

A hexadecimal table of values for the function Q is given in Table IV:

TABLE IV

| | | | | | | | | u | | | | | | | | |
|---|---|---|---|---|---|---|---|---|---|---|---|---|---|---|---|---|
| | 0 | 1 | 2 | 3 | 4 | 5 | 6 | 7 | 8 | 9 | A | B | C | D | E | F |
| Q(u) | 9 | E | 5 | 6 | A | 2 | 3 | C | F | 0 | 4 | D | 7 | B | 1 | 8 |

During simulations, the power consumption behaviour was observed with respect to each set of input variables applied to the Sbox, for the 3 logic differential dynamic families considered: DDCVSL, DyCML and the LSCML using the self-timing circuit ST1. Those three logic families have been studied to evaluate their resistance to attacks by power analysis.

The simulations have been carried out using the ELDO tool in PD-SOI (Partially Depleted Silicon On Insulator) CMOS technology with a channel width of 0.13 μm and a supply voltage of 1.2 V. The fanout loading the outputs of the Sbox are the output drivers which are simple inverters in case of the DDCVSL, and the single ended buffers in case of DyCML and LSCML. Once the behaviour and the power consumption in case of each set of inputs have been evaluated for each logic family, different statistical treatments have been applied to the data thus obtained: for each logic family, the average power consumption, the standard deviation of this power consumption, its maximum, its minimum and the following parameters were calculated:

NED—Normalised Energy Deviation: the ratio between the maximum spread on the power consumption (maximum-minimum) and the maximum of this power consumption.

$$NED = \frac{\max(P) - \min(P)}{\max(P)}$$

NSD—Normalised Standard Deviation: the ratio between the standard deviation σ on the power consumption and the mean power consumption μ.

$$NSD = \frac{\sigma}{\mu}$$

The parameters NED and NSD are given for reasons of comparison only, as they are used by the authors of SABL to assess the efficiency of the logic family they propose. Nevertheless, the two most interesting characteristics are the average power consumption and the standard deviation. Indeed, only these allow to assess the real efficiency of the countermeasure.

Before explaining the latter it has to be pointed out that, in the context of optimal statistical analysis of the power consumption, for which all measurements are perfect (no noise due to measurement) as well as the predictions (no noise on the predictions due to uncertainty), the efficiency of the attack depends only on the correlation between the practical measurements and the theoretical predictions.

Given these hypotheses, none of the dynamic and differential logic families is better than any other in terms of security. However, in the real world, the reduction in variation of power consumption makes the good measurement of the power consumption more difficult. This reduces the correlation values obtained at the end of the attack, although this is difficult to quantify and highly dependent the equipment used by the attacker to perform the measurement.

Within this context of analysis, it can be concluded that, in view of the simulation results, the LSCML logic has advantages over other considered logic families as it does not only reduce the variation in power consumption in an important manner, but it also allows to significantly reduce the power consumption. Thus, it was shown that the LSCML family is more advantageous than DDCVSL and DyCML with regard to security of encryption operations against DPA (Differential Power Analysis) attacks. Therefore it is a good candidate for implementation of encryption operators.

The results of the simulation are given in Table V.

TABLE V

| Logic style | Min power (μW) | Max power (μW) | Average power (μW) | Standard Deviation (μW) | NED | NSD |
| --- | --- | --- | --- | --- | --- | --- |
| DDCVSL | 85.534 | 86.144 | 85.834 | 0.10907 | 0.007 | 0.0013 |
| DyCML | 48.04 | 49.82 | 48.887 | 0.35789 | 0.0357 | 0.0073 |
| LSCML (ST1) | 47.914 | 48.371 | 48.102 | 0.076826 | 0.0094 | 0.0016 |

CONCLUSION

The LSCML family using the ST1 self-timing circuit is as advantageous as the DyCML logic in terms of power consumption. Therefore, it is a good solution for low-power applications.

The LSCML family using the ST2 self-timing circuit is almost as advantageous as the DDCVSL in terms of speed in large circuits, while offering moreover with regard to these the fact of being self-timed. Therefore, it is a good solution for high speed applications.

The LSCML family is more advantageous than DDCVSL and DyCML with regard to security of encryption operations against DPA (Differential power analysis) attacks. Therefore it is a good candidate for implementation of encryption operators.

It is to be understood that although preferred embodiments, specific constructions and configurations have been discussed herein for devices according to the present invention, various changes or modifications in form and detail may be made without departing from the scope and spirit of this invention.

The invention claimed is:

1. A low swing current mode logic circuit comprising:
   a current mode logic block having data inputs and outputs;
   a pre-charging circuit for pre-charging the outputs;
   a dynamic current source;
   an evaluation circuit for evaluating the logic block during an evaluation phase; and,
   a feedback path arranged between the outputs and the dynamic current source which is responsive to a difference between the outputs.

2. A logic circuit according to claim 1 wherein the feedback path comprises two transistors.

3. A logic circuit according to claim 2 wherein the transistors are PMOS transistors.

4. A logic circuit according to claim 1 further comprising a latch for maintaining the level of the outputs after the evaluation phase of operation.

5. A cascade of a plurality of logic circuits according to claim 1, wherein a first of the logic circuits receives a clock signal at an input and provides an output which forms the clock signal for a subsequent circuit.

6. A cascade according to claim 5 further comprising a buffer circuit which buffers the clock signal between adjacent logic circuits in the cascade.

7. A cascade according to claim 6 wherein the buffer circuit introduces a delay.

8. A cascade according to claim 7 wherein the delay introduced by the buffer is larger than the delay of the logic circuit.

9. A smart card comprising a logic circuit according to claim 1.

10. A microprocessor comprising a plurality of logic circuits according to claim 1.

* * * * *